United States Patent [19]

Masumoto et al.

[11] Patent Number: 4,566,323
[45] Date of Patent: Jan. 28, 1986

[54] LIQUID HELIUM LEVEL INDICATING GAUGE

[75] Inventors: Tsuyoshi Masumoto; Akihisa Inoue, both of Sendai; Yoshimi Takahashi, Shiraishi; Akira Hoshi, Izumi; Uichiro Mizutani, Nagoya, all of Japan

[73] Assignee: Aisin Seiki Kabushiki Kaisha, Kariya, Japan

[21] Appl. No.: 518,523

[22] Filed: Jul. 29, 1983

[51] Int. Cl.⁴ .............................................. G01F 23/24
[52] U.S. Cl. .................................. 73/295; 338/22 SD
[58] Field of Search ..................... 73/295; 338/25, 32, 338/26, 32 SD; 340/627; 75/126 F

[56] References Cited

U.S. PATENT DOCUMENTS

| | | | |
|---|---|---|---|
| 3,267,730 | 8/1966 | Satterthwaite et al. | 73/295 |
| 3,496,773 | 2/1970 | Comish | 73/295 |
| 3,856,513 | 12/1974 | Chen et al. | 73/295 X |
| 3,943,767 | 3/1976 | Efferson | 73/295 |
| 4,208,911 | 6/1980 | Tcherner | 374/176 X |
| 4,407,561 | 10/1983 | Wysocki | 73/295 X |

*Primary Examiner*—Daniel M. Yasich
*Attorney, Agent, or Firm*—Oblon, Fisher, Spivak, McClelland & Maier

[57] ABSTRACT

Improved liquid helium level gauge is described. The gauge includes a resistance wire sustained vertically within a liquid helium container and an electrical indicating device for producing an indication which varies with the electric resistance of said resistance wire. The resistance wire is made of a new superconductive amorphous material such as $Zr_{80}Nb_5Al_8Si_7$. The amorphous material has a superconductivity transition temperature between 4.2° and 5.0° K., a relatively high normal electric resistance and a high mechanical strength.

4 Claims, 5 Drawing Figures

LIQUID HELIUM LEVEL INDICATING GAUGE

BACKGROUND OF THE INVENTION

1. Field of the Invention

The present invention relates to gauges and more particularly to a liquid helium level indicating gauge to indicate the level of liquid helium in a container.

2. Description of the Prior Art

In the conventional level gauge for liquid helium, a superconductive wire of Nb-Ti (niobium titanium) alloy has been employed as the element for the liquid level detection. However, the gauge has the following disadvantages.

(1) Since the superconductivity transition temperature (Tc) of the superconductive Nb-Ti wire is too high for the temperature of liquid helium, the part of the wire just above the liquid level too easily enters into a superconductive state. To make this part normally conductive, it is necessary for it to be heated with Joule heat by using an electric current (about 70 mA). The heating consumes a relatively large quantity liquid helium (about 0.02 l/hour).

(2) Since the Nb-Ti wire has a low electric resistance even in the normally conductive state, the wire diameter is required to be reduced (to about 0.2 ⌀ mm) for improvement in the measuring sensitivity. Such a fine wire has a low mechanical strength and is particularly susceptible to shocks.

SUMMARY OF THE INVENTION

It is therefor an object of the present invention to provide an improved gauge for indicating liquid helium level in a container.

A further object of the present invention is to provide a gauge which consumes a small amount of liquid helium.

Another object of the present invention is to provide a gauge which has a higher sensitivity and a greater mechanical strength.

A feature of the present invention is the provision of a resistance wire made of a new amorphous superconductive material prepared by rapid quenching from a molten state, in place of the conventional Nb-Ti superconductive alloy.

The element detects a liquid helium level by measuring the electrical resistance between the ends of the amorphous element. The superconductive amorphous material is one of the superconductive materials which are composed of a parts of element Z, b parts of element M and c parts of a material composed of elements Q, R and Al and which also have superconductivity transition temperatures of 4.2°–5.0° K., which are nearly equal to or a little higher than the liquid helium temperature of 4.2° K. In the above formula, Z is one selected from the group consisting of Zr, Hf and Ti, M is one selected from the group consisting of V, Nb, Ta and the mixture thereof, Q is one selected from the group consisting of Si, Ge and the mixture thereof, and R is one selected from the group consisting of C, B, Sn and the mixture thereof; a ranges from 10 to 90 atomic %, b is below 80 atomic %, and c ranges from 10 to 25 atomic %. The composition ratio of Q is more than 2 atomic % inclusive, Al is in a ranges from 0.1 to 15 atomic % and R is less than 12 atomic % inclusive. Namely 12 atomic % or less of Q and Al can be substituted by R. More than 20 volume % of the whole superconductive amorphous alloys, according to the present invention, is in an amorphouse phase.

The sensing device of the present invention comprises the resistance wire made of the superconductive material mentioned above and an electrical indicating device. The resistance wire is sustained vertically within a liquid helium container. The lower part of the wire being in the liquid helium is in the superconductivity state. And the rest, the upper part of the wire being over the level of the liquid helium is in the normal conductive state.

The electrical indicating device produces an indication which varies with the electric resistance of the resistance wire. Usual ohmmeters and voltmeters can be used as the electrical indicating device.

One advantage of the sensing device of the present invention is low consumption of liquid helium, since the superconductive materials have almost the same superconductivity transition temperatures as the liquid helium temperature. Namely the sensing device which employs the resistance wire made of one of the superconductive materials can precisely detect the liquid helium level without giving Joule heat to the wire. Another advantage of the sensing device is that the resistance wire has a simple mechanism and a high reliability. Because the electrical resistance of the superconductive materials in the normal state is so high, the wire is not required to be made fine in order to have sensitivity improvement.

The superconductive materials obtained by superrapid quenching of the molten alloys with the above noted compositions are illustrated in TAB.1. The superconductive materials are composed of a single amorphous phase with more than 20 vol. % and a residualerystallic phase. The superconductive materials have transition temperatures of 4.2°–5.0° K. which are nearly equal to the liquid helium temperature of 4.21° K. The superconductive materials have a relatively high electrical resistance, about 190 $\mu\Omega$ cm, in normal electrical condition. The materials also have satisfactory strength and a good tape forming capability. Each said amorphous superconductive material may be formed into a wire with a length of 100–1000 mm, a width of 0.1–5 mm and a thickness of 5–50$\mu$, in accordance with the size of a liquid helium container, to be utilized as the resistance wire of the sensing device of the present invention for detection of a liquid helium level.

TABLE 1

| composition | superconductivity transition temperature |
|---|---|
| $Zr_{10}Nb_{75}Si_{13}Al_2$ | 4.43 |
| $Zr_{15}Nb_{70}Si_{13}Al_2$ | 4.21 |
| $Zr_{15}Nb_{70}Si_{10}B_3Al_2$ | 4.25 |
| $Zr_{15}Nb_{70}Si_{10}C_3Al_2$ | 4.38 |
| $Zr_{15}Nb_{70}Si_{10}Sn_3Al_2$ | 4.41 |
| $Zr_{10}Nb_{75}Si_{10}Al_5$ | 4.45 |
| $Zr_{8.25}Nb_{2.5}Al_8Si_7$ | 4.35 |
| $Zr_{80}Nb_5Al_9Si_6$ | 4.71 |
| $Zr_{80}Nb_5Al_8Si_7$ | 4.56 |
| $Zr_{77.5}Nb_{7.5}Al_8Si_7$ | 4.80 |
| $Zr_{80}Nb_5Al_6Si_9$ | 4.21 |
| $Zr_{95}Nb_5Al_{15}Si_5$ | 4.23 |
| $Zr_{81}Nb_5Al_7Si_7$ | 4.70 |
| $Zr_{80}Nb_5Al_8Ge_7$ | 4.31 |
| $Zr_{80}Nb_5Al_9Ge_6$ | 4.54 |
| $Zr_{77.5}Nb_{7.5}Al_8Ge_7$ | 4.68 |
| $Hf_{55}Nb_{30}Al_8Si_7$ | 4.8 |
| $Hf_{55}Nb_{30}Al_8Si_{11}$ | 4.6 |
| $Hf_{55}Nb_{30}Al_8Ge_7$ | 4.6 |
| $Hf_{45}Nb_{80}Al_4Ge_{11}$ | 4.9 |
| $Ti_{55}Nb_{80}Al_8Si_7$ | 4.6 |

TABLE 1-continued

| composition | superconductivity transition temperature |
|---|---|
| $Ti_{45}Nb_{40}Al_4Si_{11}$ | 4.4 |
| $Ti_{55}Nb_{30}Al_4Ge_{11}$ | 4.4 |
| $Ti_{45}Nb_{40}Al_7Ge_8$ | 4.8 |

DESCRIPTION OF THE PREFERRED EMBODIMENT

The present invention will now be described in detail by reference to the preferred embodiment.

Figure 1:
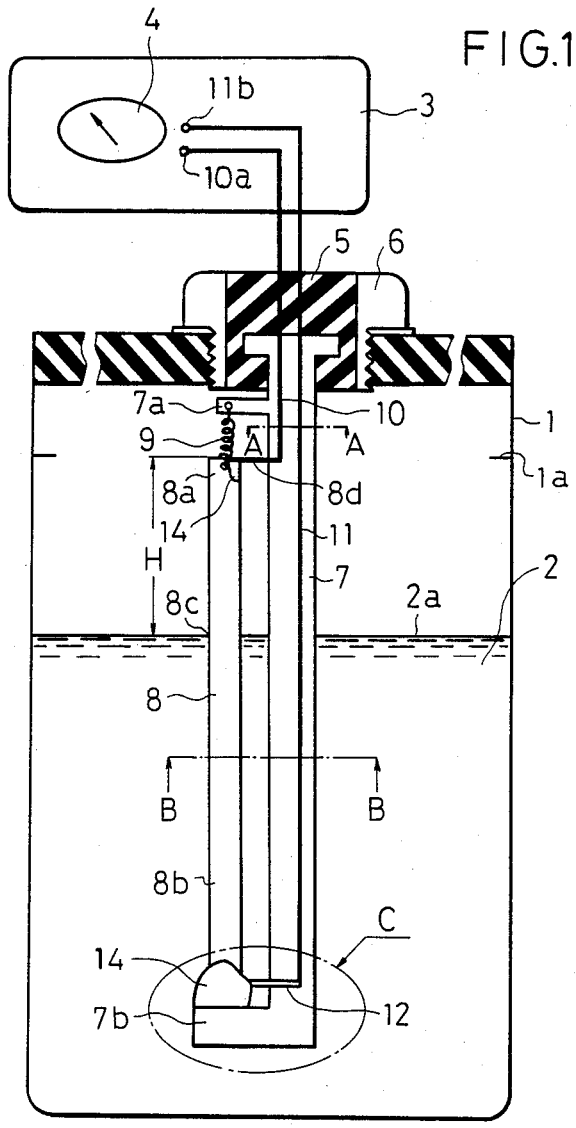
FIG. 1 is a schematic sectional view of a sensing device according to the present invention.
Figure 2:
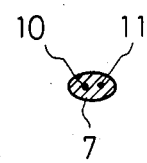
FIG. 2 is a cross-sectional views taken along the line A—A in FIG. 1.
Figure 3:
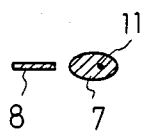
FIG. 3 is a cross-sectional view taken along the line B—B in FIG. 1.

FIG. 1 shows a measuring device or a level gauge according to the present invention.

Figure 4:
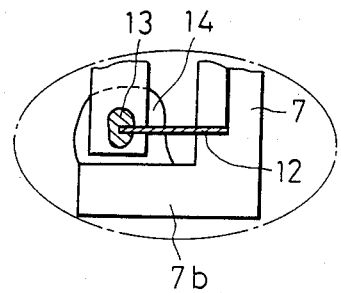
FIG. 4 is an enlarged view of partially sectioned C part in FIG. 1.

In FIG. 1, 1a is the standard level of a container 1 and 2a is the level of liquid helium 2. An electrical indicating device 3 contains a meter 4. A bolt 6 is integrated with an insulating material 5. A supporting rod 7 has an upper support 7a and a lower end 7b. A resistance wire 8 has an upper end 8a and a lower end 8b and intersects with the helium level 2a at a point 8e. A support spring 9 is also provided. Leads, 10 and 11, are connected to a power supply and the meter 4 at points 10a and 11b, respectively. A connecting wire 12 electrically connects lead 11 and resistance wire 8. The joint between connecting wire 12 and lead 11 is fixed with low temperature solder or silver paste 13 and adhesive 14 (shown in FIG. 4). The lead 10 and resistance wire 8 join at a point 8a. The joint 8a is fixed with low temperature solder and adhesive in a similar way as the lower end 8b of the resistance wire 8 and point 8a is at the same level as standard level 1a. The distance H between the point 8c (a liquid helium level 2a) and joint 8d is a reference value which indicates the quantity of the liquid helium contained in the container.

In the above noted configuration, the electrical resistance of the part of said resistance wire under the level of liquid helium 2a will become zero when an electric current is passed between said leads 10 and 11. Therefore, the value displayed on the electrical indicating device 4 shows the electrical resistance of the part of the resistance wire with a length of H between said joint 8d and the point 8c which is the liquid helium level 2a. Thus, the sensing device can measure the distance between a liquid level 2a and the standard level 1a of the container 1 and increase or decrease of the quantity results in increase or decrease of H which can be displayed on the electrical indicating devices.

Figure 5:
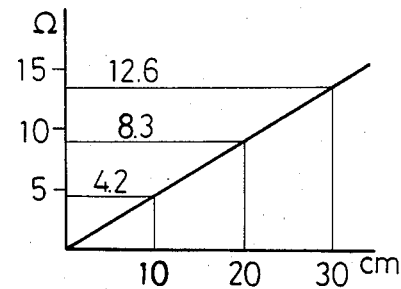
FIG. 5 is a graph showing the relationship between the electrical resistance and the length of the part above the liquid helium level of a resistance wire with the composition of $Zr_{80}Nb_5Al_8Si_7$.

The resistance wire 8 of this embodiment is composed of $Zr_{80}Nb_5Al_8Si_7$, which is obtained by superrapid quenching of the molten alloy by means of a single roll. The resistance wire 8 has a length of 350 mm, a thickness of 30 μm, and a width of 1.5 mm. The electric resistance of the wire is approximately 15 Ω at the ordinary temperature, the superconductivity transition temperature (Tc) is 4.56° K., the specific resistance (ρ) is 190 μΩcm, and the critical current density (Jc) is 400 A/cm² (4.2° K). The electrical indicator 3 may be used as a voltmeter with the voltage between the both edges of the resistance wire 8 being measured by the indicator with a constant current of 10 mA and then converted to the electrical resistance as shown in FIG. 5 or conversely the electrical indicator 3 may be constructed as an ohmmeter to provide direct system measurement.

In addition, for some of said superconductive materials which have superconductivity transition temperatures of 4.5°–5.0° K., an electric current is applied to such material by use of said lead to generate Joule heat in order to use the material in a similar ways the superconductive material with the transition temperature of 4.2° K. Even in that case, only little Joule heat is required.

We claim:

1. A sensing device for indicating the level of liquid helium within a container including in combination, a resistance wire sustained vertically within said container and an electrical indicating device for producing an indication which varies with the electrical resistance of said resistance wire, said resistance wire being made of a superconductive material of which more than 20 volume % is in an amorphous phase and which is composed of a parts of element Z, b parts of element M, and c parts of a composition of elements Q, R and Al, said Z being one selected from the group consisting of the elements of Zr, Hf and Ti, said M being one selected from the group consisting of elements of V, Nb, Ta and the mixture thereof, said Q being one selected from the group consisting of the elements of Si, Ge and the mixture thereof, said R being one selected from the group consisting of C, B, Sn and the mixture thereof, said a ranging from 10 to 90 atomic %, said b being below 80 atomic %, said c ranging from 10 to 25 atomic %, and the composition ratio of said Q being more than 2 atomic % inclusive, the composition ratio of Al being in a ranges from 0.1 to 15 atomic % and the composition ratio of said R being less than 12 atomic % inclusive.

2. A sensing device according to claim 1, wherein said superconductive material has a superconductivity transition temperature between 4.2° and 5.0° K.

3. A sensing device according to claim 1, wherein said electrical indicating device is a voltmeter.

4. A sensing device according to claim 1, wherein said electrical indicating device is an ohmmeter.

* * * * *